United States Patent
Muto et al.

(10) Patent No.: US 6,320,270 B1
(45) Date of Patent: Nov. 20, 2001

(54) SEMICONDUCTOR DEVICE AND METHOD OF PRODUCING THE SAME

(75) Inventors: Kuniharu Muto, Maebashi; Atsushi Nishikizawa, Takasaki; Jyunichi Tsuchiya, Tokyo; Toshiyuki Hata, Maebashi; Nobuya Koike, Takasaki; Ichio Shimizu, Tamamura-machi, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/500,536

(22) Filed: Feb. 9, 2000

Related U.S. Application Data

(60) Continuation of application No. 09/116,343, filed on Jul. 16, 1998, which is a division of application No. 08/547,774, filed on Oct. 25, 1995, now Pat. No. 5,808,359.

(30) Foreign Application Priority Data

Oct. 28, 1994 (JP) .................................... 6-288793

(51) Int. Cl.⁷ .......................... H01L 23/495; H01L 23/02
(52) U.S. Cl. .......................... 257/787; 257/675; 257/796; 257/684; 257/666; 257/712; 257/707; 257/717; 257/720; 257/708; 257/709; 257/788; 361/709
(58) Field of Search .................................... 257/712, 776, 257/706, 707, 717, 720, 732, 675, 708, 709, 684, 730, 787, 788, 790, 713; 362/709–712

(56) References Cited

U.S. PATENT DOCUMENTS

| | | | |
|---|---|---|---|
| 4,399,610 | 8/1983 | Moyer | 257/666 |
| 4,819,041 | 4/1989 | Redmond | 257/712 |
| 5,036,381 | 7/1991 | Lin | 257/485 |
| 5,114,880 | 5/1992 | Lin | 257/468 |
| 5,138,430 | 8/1992 | Gow, 3rd et al. | 257/712 |
| 5,150,198 | 9/1992 | Ohikata et al. | |
| 5,216,283 | 6/1993 | Lin | 257/717 |
| 5,258,649 | 11/1993 | Tanaka et al. | 257/796 |
| 5,318,451 | 6/1994 | DelPrete et al. | 439/69 |
| 5,345,106 * | 9/1994 | Doering et al. | 257/675 |
| 5,350,713 | 9/1994 | Liang | 432/217 |
| 5,394,607 * | 3/1995 | Chiu et al. | 29/827 |
| 5,402,006 | 3/1995 | O'Denley | 257/712 |

FOREIGN PATENT DOCUMENTS

| | | |
|---|---|---|
| 0253295 | 1/1988 | (EP) . |
| 0104056 | 5/1987 | (JP) . |
| 1-129951 | 5/1990 | (JP) . |
| 3-286558 | 12/1991 | (JP) . |
| 5-218262 | 8/1993 | (JP) . |

* cited by examiner

Primary Examiner—Alexander O. Williams
(74) Attorney, Agent, or Firm—Mattingly, Stanger & Malur, P.C.

(57) ABSTRACT

A QFP adapted to lowering the heat resistance and increasing the number of pins, and a method of producing the same. The QFP includes a heat-radiating metal plate having bumpers formed at the four corners thereof as a unitary structure, a semiconductor chip mounted on the heat-radiating metal plate, leads provided on the heat-radiating metal plate and surrounding the peripheries of the semiconductor chip, bonding wires for connecting the leads to the semiconductor chip, and a sealing resin member for sealing part of the semiconductor chip, inner leads of the leads, bonding wires and part of the heat-radiating metal plate. The tips of the bumpers integrally formed with the heat-radiating metal plate are positioned outside the tips of the outer leads that are protruding from the sealing resin member. In the QFP producing method, the heat-radiating metal plate having the bumpers and the lead frame having the leads are secured outside the sealing resin member.

4 Claims, 10 Drawing Sheets

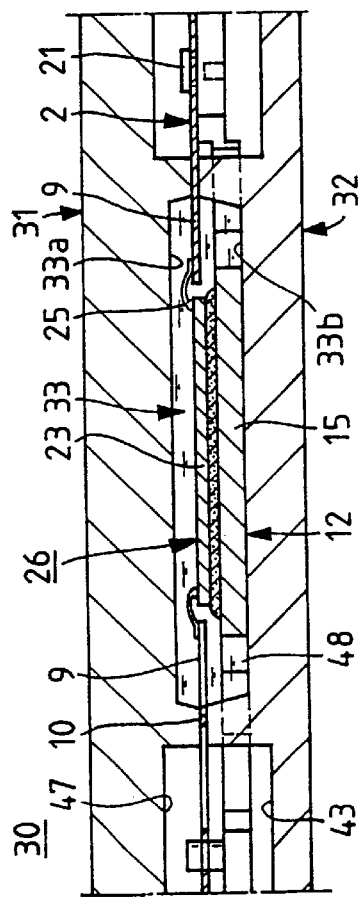
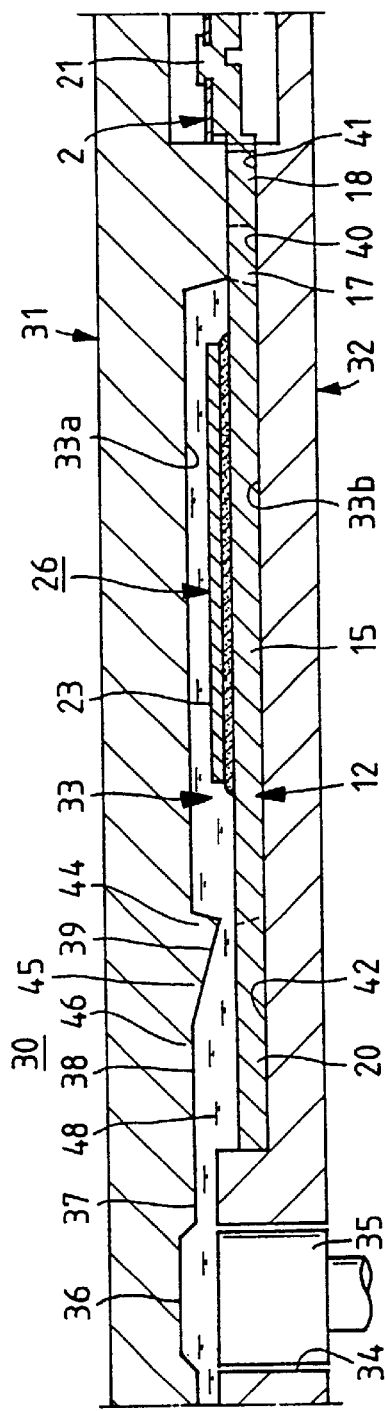
FIG. 6(a)
FIG. 6(b)

SEMICONDUCTOR DEVICE AND METHOD OF PRODUCING THE SAME

This is a continuation application of U.S. Ser. No. 09/116,343, filed Jul. 16, 1998; which is a divisional application of U.S. Ser. No. 08/547,774, filed Oct. 25, 1995, now U.S. Pat. No. 5,808,359.

BACKGROUND OF THE INVENTION

The present invention relates to a technology for producing semiconductor devices and, particularly, to a semiconductor device equipped with a resin-sealed package of surface mount type, such as one which has many pins and a small heat resistance, and is small in size and is produced at a decreased cost.

As ICs are now produced having many functions, and are highly densely fabricated and operate at high speeds, it has been desired to develop a surface mount resin-sealed package having many lead pins with a good heat-emitting property or a small heat resistance. A surface mount type resin-sealed package which is constituted as described below has been proposed in, for example, Japanese Patent Laid-Open No. 286558/1991.

In such a package, the tabs to which a semiconductor pellet is bonded and heat-radiating fin leads are integrally formed together, and the heat-radiating fin leads and heat-radiating fins outwardly protruding from a sealing resin member of the package are integrally formed together. Moreover, a heat sink is buried in the package on the side of the back surface of the tabs, and is mechanically coupled to the heat-radiating fin leads inside the package.

A QFP (quad flat package) which has a good heat-radiating property and whose outer leads are prevented from deforming has been disclosed in Japanese Patent Laid-Open No. 218262/1993.

This QFP employs a lead frame and tabs to which a semiconductor pellet is bonded and heat-radiating fin leads are formed integrally. The heat-radiating fin leads and heat-radiating fins outwardly protruding from the sealing resin member of the package are integrally formed, the tips of the heat-radiating fins being outwardly protruded beyond the tips of the outer leads.

SUMMARY OF THE INVENTION

In the former device in which the heat sink and the heat-radiating fin leads are mechanically coupled together inside the sealing resin, however, the coupling portions impose a limitation upon the arrangement of leads and upon the number of pins. Besides, the pellet must be bonded, wires must be bonded and sealing with resin must be executed after a plurality of heat sinks are coupled to a series of lead frames, deteriorating the throughput of production.

In the latter device in which the leads and the heat-radiating fins are constituted by a lead frame, a problem arises in that it is impossible to design a package, raving a sufficiently high heat-radiating performance.

The object of the present invention is to provide a semiconductor device whose outer leads can be prevented from being deformed, yet with a high heat-radiating performance.

Another object of the present invention is to provide a method of producing semiconductor devices at a low cost.

The above and other objects as well as novel features of the present invention will become obvious from the description of the specification and the accompanying drawings.

Among the inventions disclosed in this application, representative embodiments will be briefly described below.

That is, the semiconductor device has a feature that the semiconductor pellet is bonded to a main surface of the heat sink which is partly buried in a sealing resin member of a square shape, and the heat sink has a plurality of bumpers formed integrally therewith, the bumpers protruding from the corners of the sealing resin member and having tips which are arranged on the outer sides of the row of tips of the outer leads which are led out from the four sides of the sealing resin member.

A method of producing semiconductor devices comprises:

a step of preparing a series of lead frames having unit lead frames which are arranged in a row and in each of which the outer leads and inner leads are radially arranged from the region where a semiconductor pellet is provided;

a step of preparing a series of heat sinks having unit heat sinks which are arranged in a row, and having main surfaces to which the semiconductor pellets are to be bonded and a plurality of bumpers that are integrally formed together therewith;

a step of coupling the series of lead frames and the series of heat sinks together outside at least a pair of bumpers of the unit heat sinks;

a step of bonding the semiconductor pellets onto main surfaces of the unit heat sinks;

a step for electrically connecting the electrodes of the semiconductor pellets to the inner leads with bonding wires thereto;

a step of sealing the semiconductor pellets, inner leads, and at least the main surfaces of the unit heat sinks on the semiconductor pellet side with a resin;

a step of cutting the series of lead frames to form the unit lead frames; and a step of cutting off the unit heat sinks from the series of heat sinks.

According to the above-mentioned semiconductor device, the heat generated by the semiconductor pellet is conducted to the heat sink; i.e., the semiconductor pellet is cooled quite efficiently.

Moreover, since the tips of bumpers arranged at the corners of the sealing resin member protrude outwardly beyond the tips of the outer leads, in case an external force is unexpectedly given to the package during the steps of production, during the shipment to the user, or while it is being mounted by the user, the bumpers absorb the external force, preventing the outer leads from being deformed.

According to the above-mentioned method of producing semiconductor devices in which the coupling portion between the heat sink and the lead frame is not buried in the sealing resin member, no limitation is put on the layout of the inner leads by the coupling portion in the sealing resin member. Additionally an increase in the degree of freedom of laying out the wirings permits the bumpers to be arranged, making it possible to produce even semiconductor devices that do not have leads for the heat-radiating fins.

Since the heat sink is coupled to the lead frame, furthermore, the devices for fabricating the semiconductor pellets and inner leads of the prior art may be employed. Before being coupled, moreover, the heat sink is separate from the lead frame. Therefore, the thickness of only the heat sink can be easily increased, contributing to further enhancing the heat-radiating performance with ease.

BRIEF DESCRIPTION OF THE DRAWINGS

FIG. 1 illustrates a QFP of an embodiment of the present invention, wherein

FIG. 3 illustrates a series of heat sink assemblies, wherein

FIG. 4 illustrates the lead frame and the heat sink assembly after they are coupled together, wherein

FIG. 5 illustrates the assembly after a pellet and wires are bonded, wherein

FIG. 6 illustrates a step of forming a sealing resin member, wherein FIG. 6(a) is a front sectional view illustrating a part thereof, and FIG. 6(b) is a vertical sectional view along the diagonal line of the cavity;

FIG. 7 illustrates a metal mold used for the molding step, wherein

FIG. 8 illustrates the top force of the metal mold, wherein

FIG. 9 illustrates a resin molded article, wherein FIG. 10 illustrates a QFP of an embodiment of the present invention, which is mounted, wherein

DESCRIPTION OF THE PREFERRED EMBODIMENTS

Figure 1A:
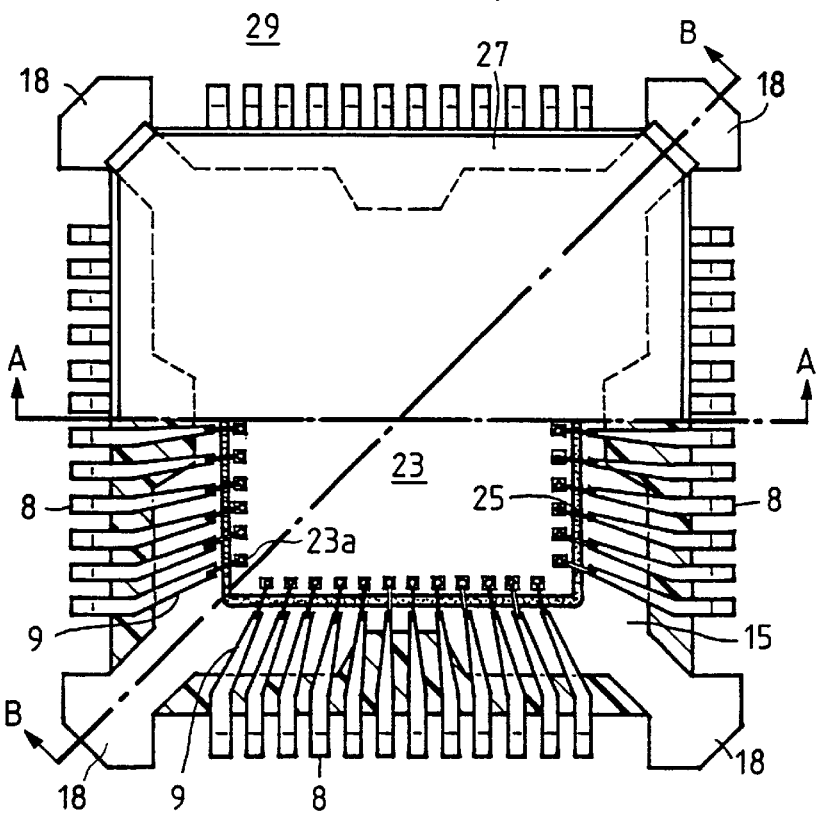
FIG. 1(a) is a plan view illustrating major portions.
Figure 1B:
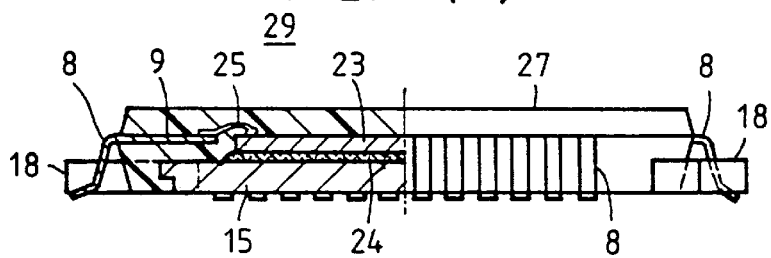
FIG. 1(b) is a sectional view along the line A—A of FIG. 1(a)
Figure 1C:
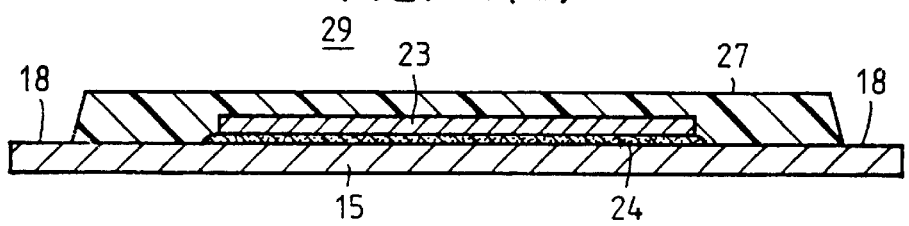
FIG. 1(c) is a sectional view along a diagonal line B—B of FIG. 1(a)

In the embodiment of FIG. 1, the semiconductor device of the invention is constituted as a resin-sealed QFP 29 having a good heat-radiating property, which is a semiconductor integrated circuit device that realizes a low heat resistance.

The QFP 29 includes a silicon semiconductor pellet (hereinafter referred to as a pellet) 23, which has the shape of a square small plate and on the main surface of which is formed a semiconductor element, a heat sink 15 on which the pellet 23 is mounted, a plurality of inner leads 9 radially arranged along the four sides of the pellet 23, bonding wires 25 that electrically connect the inner leads 9 to electrode pads 23a which are external terminals formed on the main surface of the pellet 23, outer leads 8 integrally coupled to the inner leads 9, respectively, and a sealing resin member 27 which seals the pellet 23, part of the heat sink 15, inner leads 9 and wires 25. The sealing resin member 27 is made of an epoxy resin having an insulating property and has a shape of a square flat board which is sufficiently larger than the pellet 23. The heat sink 15 is made of a material having a good heat conducting property, and has the shape of a square flat plate which is smaller than the sealing resin member 27 but is larger than the pellet 23. Bumpers 18 are integrally formed together with the heat sink 15 and protrude from the four corners thereof, the bumpers 18 outwardly protruding from the four corners of the sealing resin member 27 along the diagonal lines. The tips of the bumpers 18 protrude from the sides of the sealing resin member 27, and are disposed on the outer sides beyond the tips of the outer leads 8 that are bent like gull wings.

A method of producing QFPs according to the present embodiment of the present invention will be described.

Figure 2:
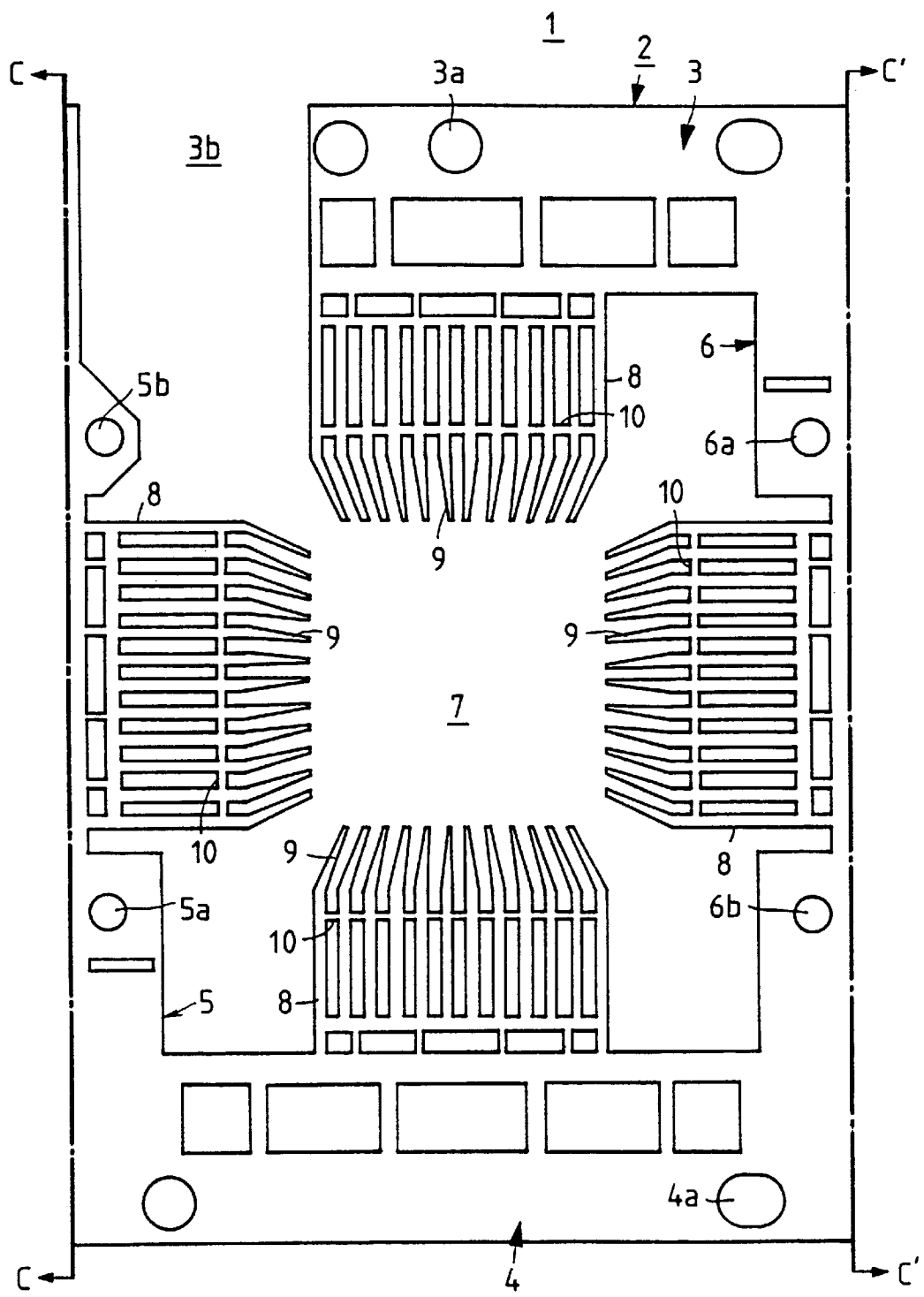
FIG. 2 is a plan view illustrating a part of a series of lead frames used in a method of producing a QFP according to an embodiment of the present invention.

In this embodiment, a series of lead frames 1 shown in FIG. 2 are used for producing QFPS. The series of lead frames 1 are made of a thin plate of a copper-containing material (copper or copper alloy) which is integrally formed by a suitable means such as punching or etching. On the surfaces of the series of lead frames 1 is deposited a film (not shown) for properly effecting the wire bonding that will be described later, by electroplating with silver (Ag) or the like. The series of lead frames 1 are constituted by a plurality of unit lead frames 2 which are arranged in a row in the lateral direction. The series of lead frames 1 are constituted by a repetition of the same pattern with a region demarcated by dash-and-dot lines C—C, C'—C' of FIG. 2 as a unit lead frame. Basically, hereinafter, a unit lead frame will be described and shown.

The unit lead frame 2 includes a first outer frame (top rail) 3, a second-outer frame (bottom rail) 4, a third outer frame (side rail) 5, and a fourth outer frame (side rail) 6, these outer frames 3, 4, 5 and 6 forming a square shape. The first outer frame 3 and the second outer frame 4 have pilot holes 3a and 4a, respectively, and the third outer frame 5 and the fourth outer frame 6 have small holes 5a and 6a for mechanical coupling, and small holes 5b and 6b for positioning in a pair of diagonally opposite positions. A notch 3b for arranging a sub-runner is formed in a position connecting the first outer frame 3 and the third outer frame 5 together, and the first outer frame 3 is cantilevered at the notch 3b.

The lead frame 2 having four outer frames 3, 4, 5 and 6 is so formed as to surround a square region 7 for arranging a semiconductor pellet, the region 7 having a size corresponding to that of the pellet. A plurality of outer leads 8 are formed in parallel at regular intervals along the peripheries of the inner sides of the four outer frames 3, 4, 5 and 6, and the inner leads 9 are integrally coupled to the outer leads 8, respectively. The inner leads 9 are so arranged as to surround the region 7, and the tips on the inner side thereof are arranged nearly in a straight line along the sides of the region 7. Dam bars 10 are formed among the neighboring outer leads 8.

Figure 3A:
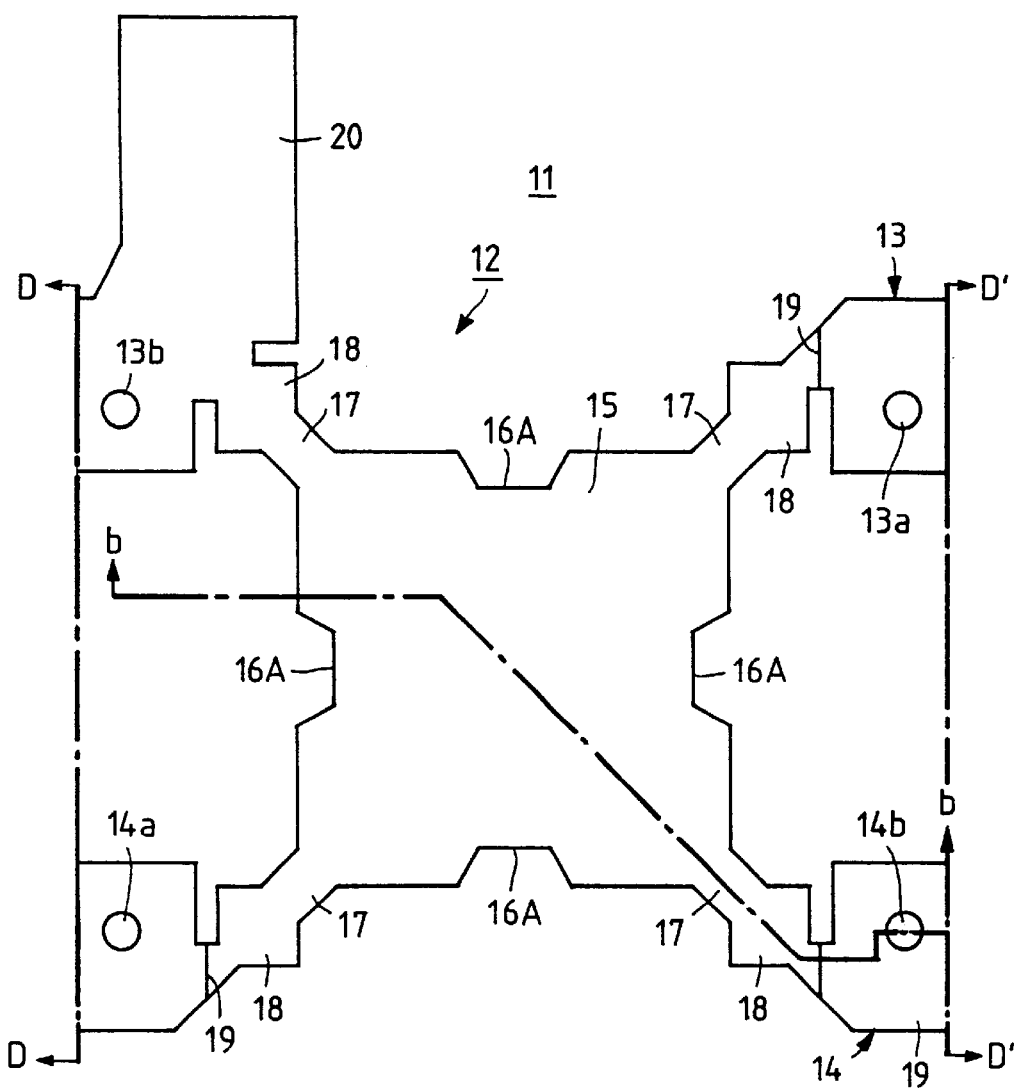
FIG. 3(a) is a plan view illustrating a part thereof.
Figure 3B:
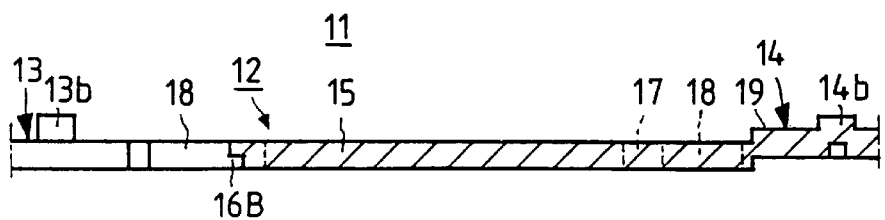
FIG. 3(b) is a sectional view along the line b—b of FIG. 3(a)

In this embodiment, the QFPs are produced using a series of heat sink assemblies 11 shown in FIG. 3. The series of heat sink assemblies 11 are made of a plate made of a copper-containing material (copper or copper alloy) having a thickness which is about four times as large as the thickness of the series of lead frames 1, and are integrally formed by punching. The series of heat sink assemblies 11 are constituted by a plurality of unit heat sink assemblies 12 which are arranged in a row in the lateral direction, each heat sink assembly 12 being arranged to mate with the respective unit lead frame 2 of the series of lead frames 1. The series of heat sink assemblies 11 are constituted by a repetition of the same pattern with a region demarcated by dash-and-dot lines D—D, D'—D' of FIG. 3 as a unit heat sink 12. Basically, hereinafter, the unit heat sink 12 will be described and shown.

The heat sink assembly 12 has a first outer frame (top rail) 13 and a second outer frame (bottom rail) 14, the two outer frames 13 and 14 being arranged in parallel. In the first outer frame 13 and in the second outer frame 14 is formed a heat sink 15 of nearly a square shape as a unitary structure, the heat sink 15 being smaller than the sealing resin member but larger than the pellet. On the main surface of the heat sink 15 on the bonding side of the pellet is deposited a film (not shown) for adequately bonding the pellet by electroplating with silver (Ag) as will be described later.

A trapezoidal notch 16A is formed in a central portion of each of the four sides of the heat sink 15. Furthermore, a stepped portion 16B is formed on the side of the heat sink 15 in a manner that the upper surface protrudes. A bumper-hanging bar 17 is formed at each of the four corners of the heat sink 15. On the outer side of each bumper-hanging bar 17 is provided a bumper 18 which is formed in a shape of a square plate having a predetermined thickness. The bumpers 18 have such a size that the tips thereof are located on the outer sides of the tips of the outer leads that are bent in the form of a gull wing. The four bumpers 18 are integrally coupled to the first outer frame 13 and to the second outer frame 14, respectively, and the first outer frame 13 and the second outer frame 14 are integrally formed together with the bumpers 18, bumper-hanging bars 17 and the heat sink 15.

In the first outer frame 13 and in the second outer frame 14 are arranged stepped portions 19 for floating the inner leads from the heat sink on the outer bumper of the bumpers 18 at three places except one side of the first outer frame 13, the stepped portions 19 being so formed by pressing that the upper surfaces thereof are in flush. The height of the stepped portion 19 is set to a minimum value at which an insulation gap between the inner leads and the heat sink 15 can be ensured. On the upper surfaces of the three stepped portions 19 of the first outer frame 13 and the second outer frame 14 are formed a pair of protuberances 13a and 14a for mechanical coupling and a protuberance 14b for positioning by pressing. At a place of the first outer frame 13 where no stepped portion 19 is formed, a protuberance 13b forms a pair together with the positioning protrusion 14b of the second outer frame 14 along a diagonal line with respect to the center of the heat sink 15. These protuberances are so formed as to correspond to the above-mentioned coupling holes 5a, 6a and the positioning holes 5b, 6b.

A protruded portion 20 for arranging a sub-runner is outwardly formed near the positioning protuberance 13b of the first outer frame 13, the protruded portion 20 corresponding to the notch 3b for arranging a sub-runner in the above-mentioned lead frame 2. The length of the protruded portion 20 in a direction where it separates away from the first outer frame 13 corresponds to the length of the sub-runner that will be described later, and the lateral width in the direction perpendicular to the longitudinal direction is larger than the width of the sub-runner.

Figure 4A:
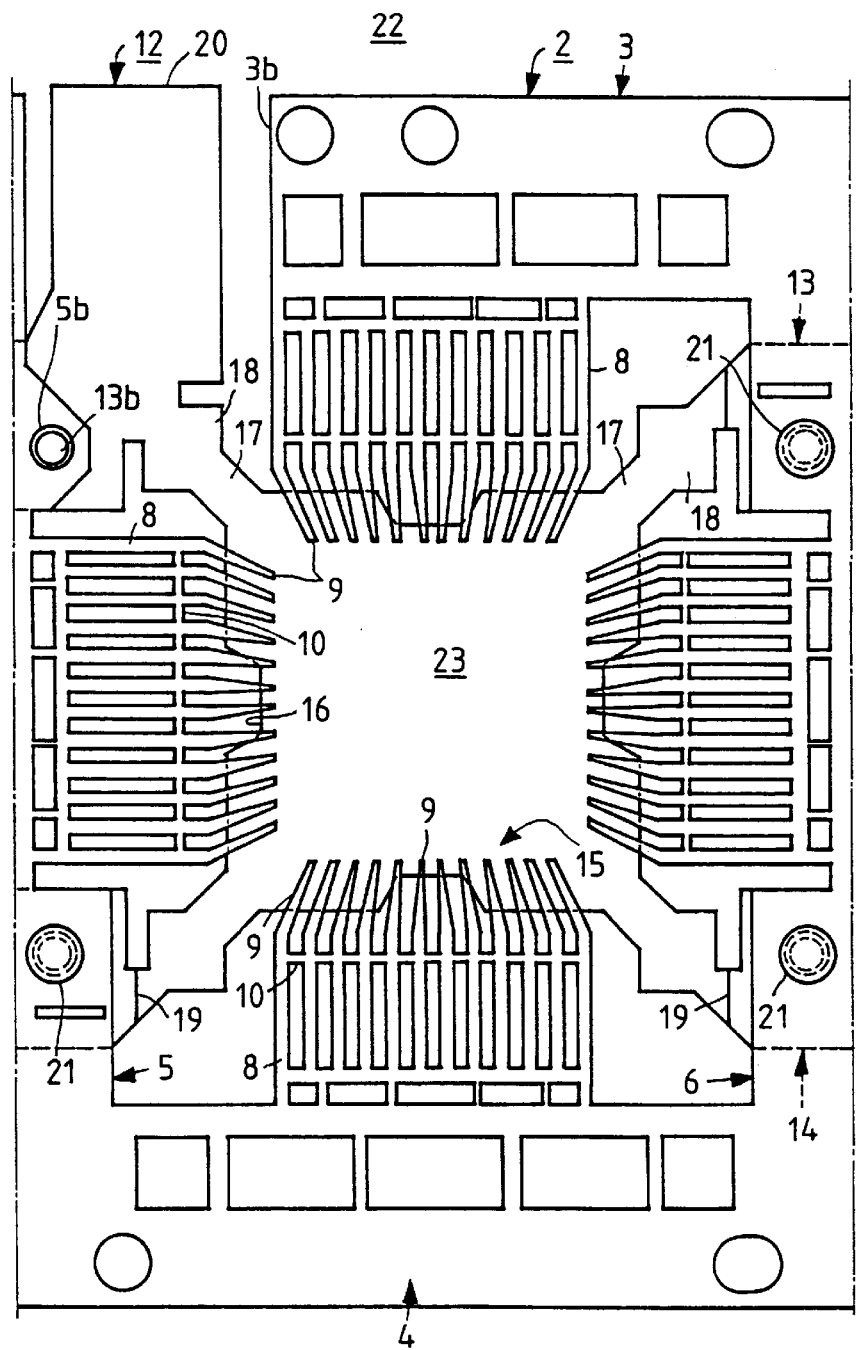
FIG. 4(a) is a plan view illustrating a part thereof and FIG. 4(b) is a front view.
Figure 4B:
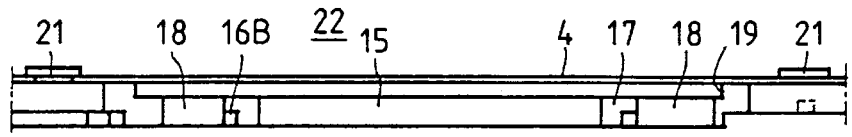

The series of lead frames 1 and the series of heat sink assemblies 11 are integrally fabricated in a step of integration so that the individual units are superposed as shown in FIG. 4. That is, the lead frames 2 and the heat sink assemblies 12 are arranged and superposed vertically in such a way that the regions 7 for disposing the pellets are concentric with the heat sinks 15. In this case, coupling protuberances 13a, 14a and positioning protuberances 13b, 14b on the heat sink assembly 12 side are inserted in the coupling holes 5a, 6a and in the positioning holes 5b, 6b on the lead frame 2 side, respectively. Thus, the lead frame 2 and the heat sink assembly 12 are accurately positioned relative to each other. Then, the upper ends of the two coupling protuberances 13a, 14a are caulked (mechanically deformed) thereby to form coupling portions 21 in the shape of a rivet head which is greater than the two coupling holes 5a, 6a. Peripheries of the two coupling holes 5a, 6a in the lead frame 2 are sandwiched between the two stepped portions 19 of the two coupling portions 21, whereby the lead frame 2 and the heat sink assembly 12 are secured together, superposed one upon the other.

The superposing work, insertion work and caulking work can be simultaneously executed for a plurality of lead frames 2 and heat sink assemblies 12. Therefore, these operations are executed very efficiently.

In a coupled member 22 in which the lead frame 2 and the heat sink assembly 12 are superposed vertically as described above, the tips on the inner side of a group of inner leads 9 of the upper lead frame 2 are overlapped on the inside with the outer peripheral edges of the heat sink 15 of the lower heat sink assembly 12 by a predetermined length when viewed from above, and are floated above the upper surface of the heat sink 15 by the height of the stepped portion 19.

Figure 5A:
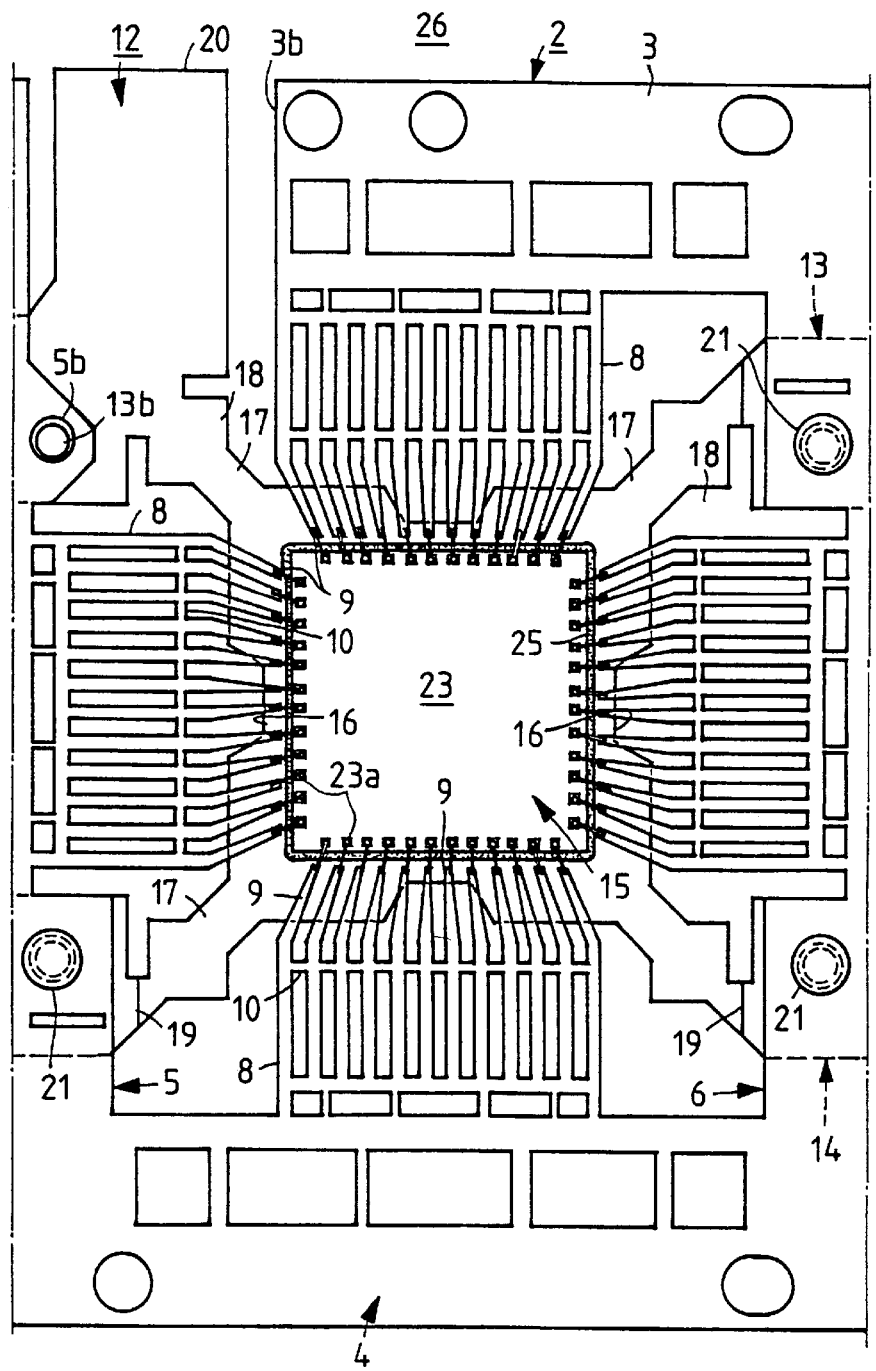
FIG. 5(a) is a plan view illustrating a part thereof.
Figure 5B:
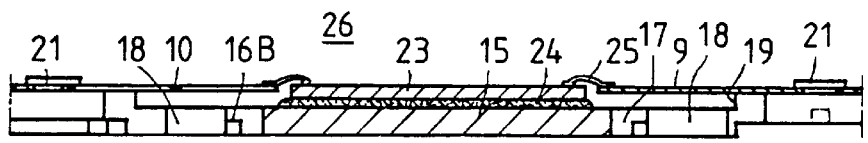
FIG. 5(b) is a vertical sectional view.

In a pellet-bonding step, as shown in FIG. 5, the pellet bonding is executed for each of the heat sinks 15 of the coupled members 22 in which the series of lead frames 1 and the series of heat sink assemblies 11 are coupled together as mentioned above. Then, in a wire-bonding step, the wires are bonded for each of the pellets and lead frames 2. Here, since the coupled members 22 are constituted in series, these bondings are executed for each of the units as the coupled members 22 are fed pitch by pitch in the longitudinal direction. The thickness and shape of the series of lead frames are the same as those of the conventional series of lead frames and, hence, the above-mentioned works are carried out using the conventional pellet-bonding device and the wire-bonding device.

Referring to FIG. 5, the pellet 23 is formed in the shape of a square plate smaller than the heat sink 15. The pellet 23 is disposed on the upper surface of the heat sink 15, and is fastened by a bonding layer 24 formed between the heat sink 15 and the pellet 23. In this embodiment, the bonding layer 24 is formed of a solder layer. That is, the pellet 23 is bonded to the heat sink 15 through the bonding layer 24 on which the pellet 23 is placed in a state that the solder foil is placed on the upper surface of the heat sink 15 and heated.

The bonding layer may be composed of a gold-silicon eutectic layer or a silver paste adhesive layer other than the solder layer. Here, it is desirable that the bonding layer formed does not hinder the conduction of heat from the pellet 23 to the heat sink 15. The bonding layer 24 of solder not only has a high heat conductivity but also is rich in softness, and absorbs mechanical stress that acts between the pellet 23 and the heat sink 15.

After an integrated circuit made up of a group of semiconductor elements and wiring circuits is fabricated through an ordinary wafer processing step in the process of producing semiconductor devices, the pellet 23 is cut into a predetermined shape in the dicing step, thus producing a semiconductor device.

The wires 25 are bonded at both ends to electrode pads 23a of the pellet 23 and to the tips of the inner leads 9 to thereby electrically connect the pellet 23 and the inner leads 9 together. Here, since the inner tips of the inner leads 9 are overlapped on the peripheral portions of the heat sink 15, the reaction force against the press of the wires 25 can be obtained from the heat sink 15 during the bonding of wires to the inner leads. Accordingly, the wires are bonded using a conventional thermocompression type wire-bonding device, ultrasonic thermocompression type wire-bonding device or ultrasonic wire-bonding device.

Figure 7A:
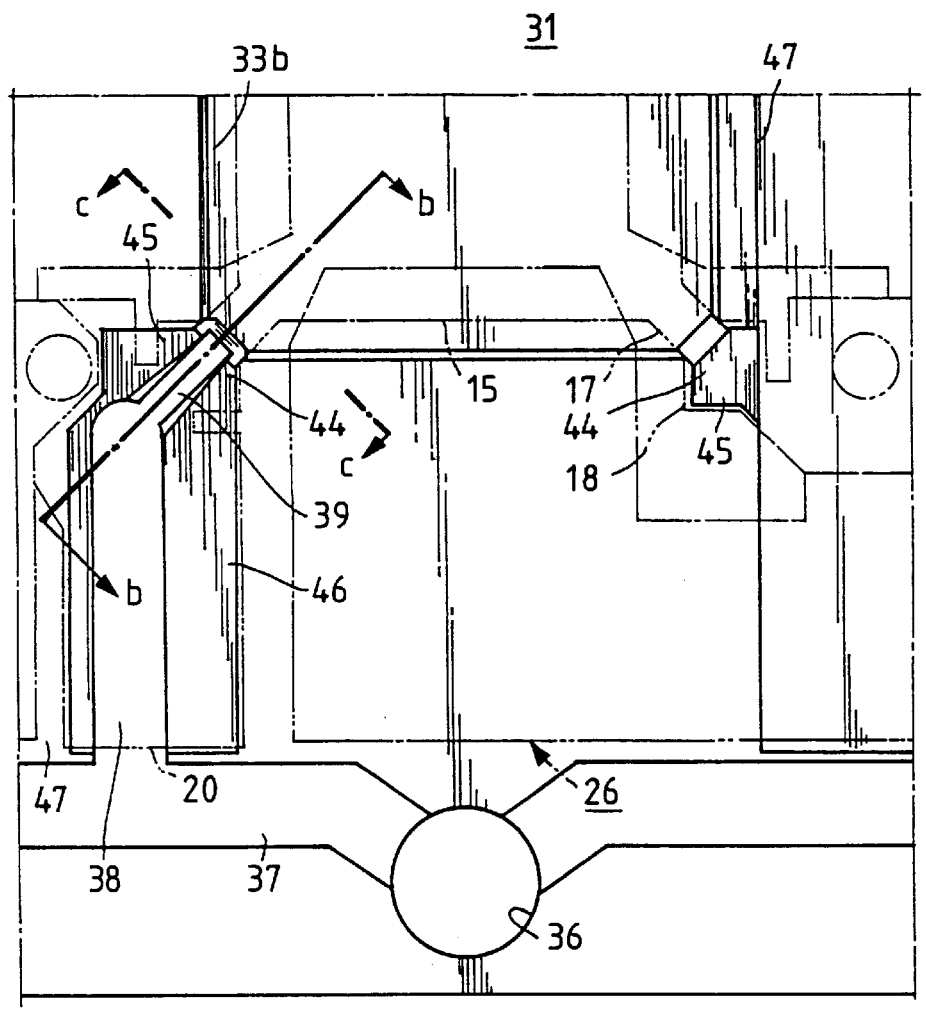
FIG. 7(a) is a bottom view illustrating a part thereof.
Figure 7B:
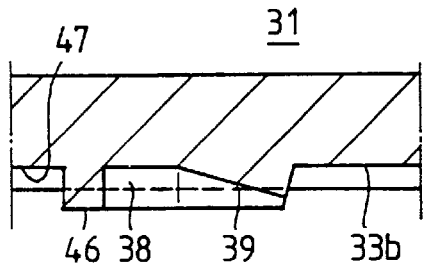
FIG. 7(b) is a sectional view along the line b—b of FIG. 7(a)
Figure 7C:
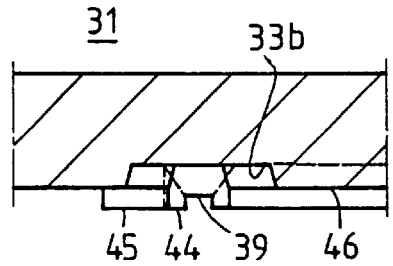
FIG. 7(c) is a sectional view along the line c—c of FIG. 7(a)
Figure 8A:
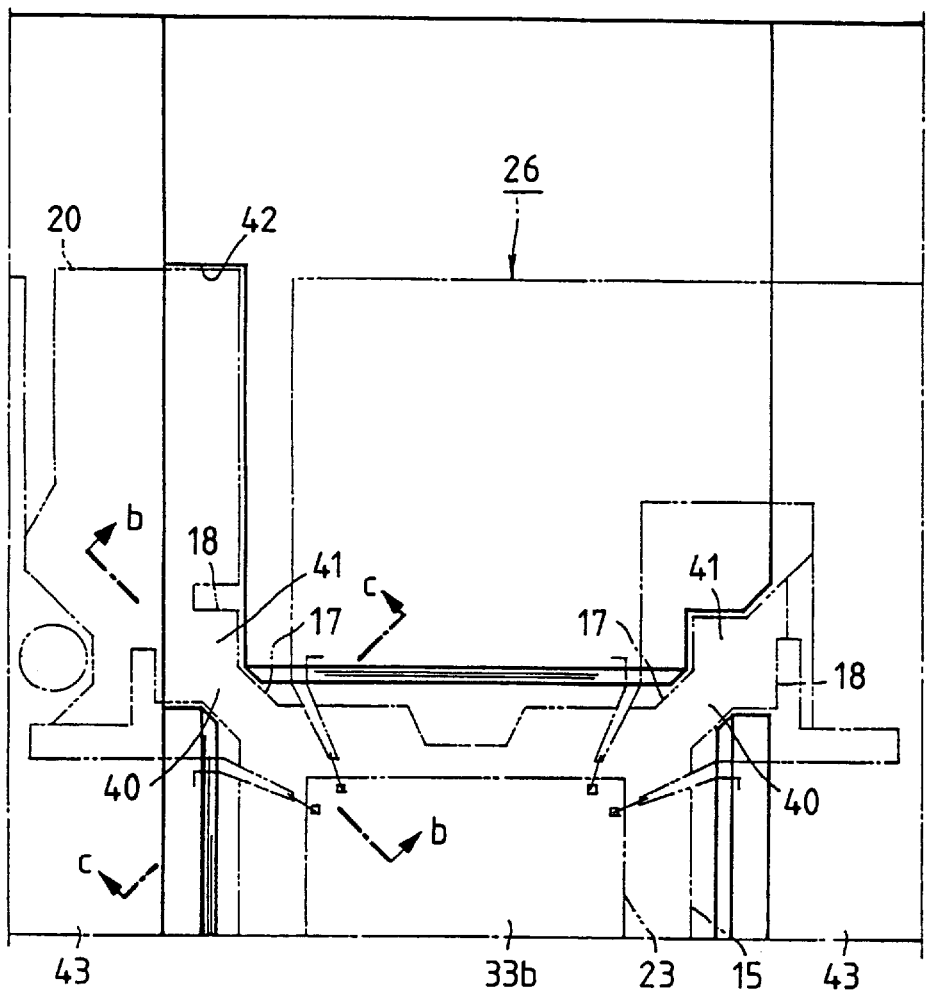
FIG. 8(a) is a plan view illustrating a part thereof.
Figure 8B:
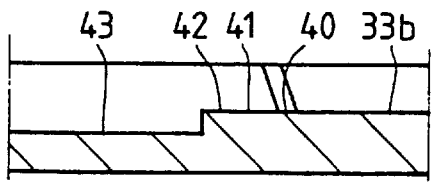
FIG. 8(b) is a sectional view along the line b—b of FIG. 8(a)
Figure 8C:
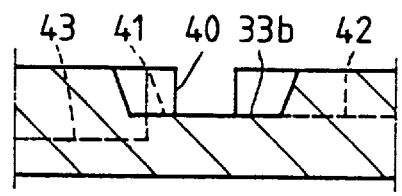
FIG. 8(c) is a sectional view along the line c—c of FIG. 8(a)
Figure 9A:
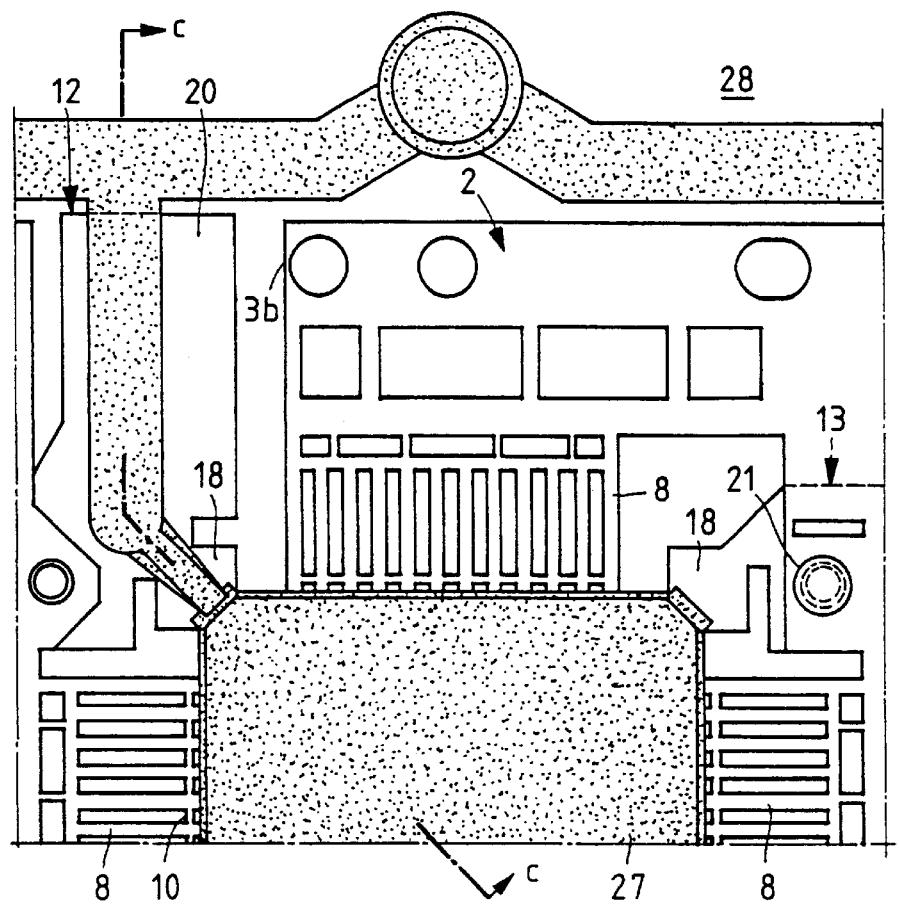
FIG. 9(a) is a plan view illustrating a part thereof.
Figure 9B:
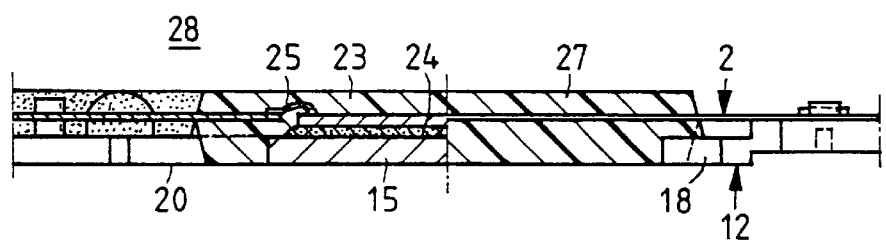
FIG. 9(b) is a sectional view along the line b—b of FIG. 9(a)
Figure 9C:
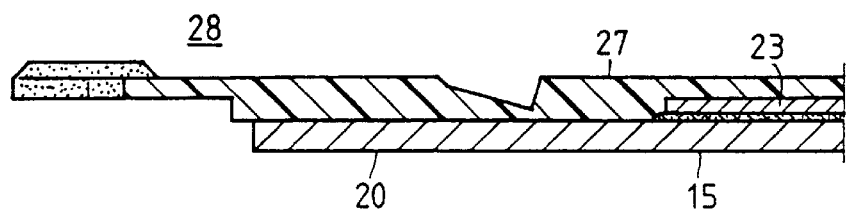
FIG. 9(c) is a sectional view along the line c—c of FIG. 9(a)

Using a transfer-molding device 30 in the step of sealing with the resin shown in FIGS. 6 to 8, sealing resin members 27 shown in FIG. 9 are simultaneously molded for each of the assemblies of the coupled member 22 to which the pellet 23 and the wires 25 have been bonded as shown in FIG. 5.

The transfer-molding device 30 shown in FIGS. 6 to 8 is equipped with a pair of upper force plates 31 and lower force 32 that are clamped to each other by a cylinder device or the like (not shown). In the mating surfaces of the upper force plate 31 and the lower force plate 32 are formed upper cavity recessed portions 33a and lower cavity recessed portions 33b in plural pairs to form cavities 33. Here, however, the drawings and the description deal with only one unit like the series of lead frames and the series of heat sink assemblies. The shape of the cavity 33 corresponds to the square shape defined by dam bars 10 of the lead frame 2 in the assembly 26. The height of the cavity 33 is greater than the height of the assembly 26. The depth of the upper cavity recessed portion 33a is greater than the height of the loop of the wire 25 in the assembly 26. The depth of the lower cavity recessed portion 33b is equal to the height from the lower surface of the heat sink 15 to the upper surface of the stepped portion 19 in the assembly 26.

In the mating surface of the lower force plate 32 is formed a pot 34 into which is inserted a plunger 35 that is moved back and forth by being driven by the cylinder device (not shown) so as to feed a resin which is a molding material. In the mating surface of the upper force plate 31 is formed a cull 36 opposed to the pot 34, and there are further formed a main runner 37 and a sub-runner 38 which communicate with each other. The end of the sub-runner 38 is connected to the gate 39 formed at a predetermined corner portion that will be described later in the upper cavity recessed portion 33a, and the gate 39 is so formed as to inject the resin into the cavity 33.

In this embodiment, four holes 40 for containing bumper-hanging bars are formed in the mating surface of the lower force plate 32 at four corners of the lower force cavity recessed portions 33b integrally with the cavity recessed portions 33b. Therefore, the corners of the lower cavity recessed portion 33b are open because their corner portions are cut away. The hole 40 for containing the bumper-hanging bar has a horizontal outline which corresponds to the horizontal outline of a bumper-hanging bar 17 of the heat sink assembly 12 and, hence, the hole 40 for containing the bumper-hanging bar contains the bumper-hanging bar 17. In the mating surface of the lower force plate 32 are formed holes 41 for containing bumpers at positions on the outer side of the holes 40 for containing bumper-hanging bars, the holes 41 being continuous to the holes 40 for containing bumper-hanging bars. A hole 41 for containing a bumper has a horizontal outline that corresponds to the horizontal outline of the bumper 18 of the heat sink assembly 12. Therefore, the holes 41 contain the bumpers 18, respectively.

In the mating surface of the lower force plate 32 are further formed holes 42 for containing protruded portions on the outer side of the holes 41 for containing bumpers that correspond to the gates 39 of the upper force plate 31, the holes 42 being so provided as to be partly overlapped with the holes 41 for containing bumpers. The holes 42 for containing protruded portions correspond to the horizontal outlines of the protruded portions 20 of the heat sink assembly 12 and, hence, serve to contain the protruded portions 20. In the mating surface of the lower force plate 32 are further formed a pair of escape grooves 43 at both side suitably away both sides of the cavity recessed portion 33b.

On the other hand, in the mating surface of the upper force plate 31 are formed four protuberances 44 for filling the holes that contain bumper-hanging bars at four corners of the upper force cavity recessed portion 33a. The horizontal outline of each protuberance 44 corresponds to the horizontal outline of the hole 40 for containing a bumper-hanging bar, and the height of each protuberance 44 is set to a value obtained by subtracting the thickness of the bumper-hanging bar 17 from the depth of the hole 40. Therefore, the hole 40 is filled with the protuberance 44 and with the bumper-hanging bar 17. That is, the notches formed at corners of the lower force cavity recessed portion 33b and opened by the hole 40 are closed by the protuberances 44.

Protuberances 45 for filling the bumper-containing holes are formed on the outer sides of the protuberances 44 that fill the holes for containing bumper-hanging bars in the mating surface of the upper force plate 31, the protuberances 45 being formed integrally with the protuberances 44 that fill the holes for containing bumper-hanging bars. The horizontal outline of the protuberance 45 corresponds to the horizontal outline of the bumper 18 of the heat sink assembly 12 and, hence, the protuberance 45 serves, in cooperation with the bumper 18, to fill the hole 41.

Moreover, protuberances 46 for filling the holes that contain protuberances are formed on the outer sides of the protuberances 45 for filling the holes that contain bumpers at positions corresponding to the gates 39 on the mating surface of the upper force plate 31, the protuberances 46 being formed continuously to the protuberances 45 for filling the holes that contain bumpers. The horizontal outline of the protuberance 46 corresponds to the horizontal outline of the protruded portion 20 of the heat sink assembly 12. Therefore, the protuberance 46 and the protruded portion 20 fill the hole 42. The sub-runner 38 is formed in the surface of the protrusion 46 mating with the protruded portion 20, and a gate 39 is formed in the surfaces of the protuberances 45, 44 continuous to the protuberance 46, which mate with the bumper 18 and the bumper-hanging bar 17. In the mating surface of the upper force plate 31 are further formed a pair of escape grooves 47 suitably away from both sides of the cavity recessed portion 33a.

Next, described below is a method of Sealing the assembly 26 with the resin using the transfer-molding device 30.

First, the assembly 26 is placed on the lower force plate 32. In this case, the heat sink 15 is contained in the lower force cavity recessed portion 33b, and the bumper-hanging bar 17, bumper 18 and protruded portion 20 at each corner are contained in the holes 40, 41 and 42, respectively. In this state, the lower surfaces of the heat sink 15, bumper-hanging bar 17, bumper 18 and protruded portion 20 are in contact with the bottom surfaces of the cavity recessed portion 33b and of the holes 40, 41 and 42. The lower surface of the lead frame 2 is in contact with the mating surface of the lower force plate 32.

Then, the upper force plate 31 and the lower force plate 32 are clamped together. When they are clamped together, the periphery of the dam bar 10 of the lead frame 2 is sandwiched from the upper and lower directions between the mating surfaces of the upper force plate 31 and the lower force plate 32. Moreover, the protuberances 44, 45 and 46 formed on the mating surface of the upper force plate 31 are fitted into the holes 40, 41 and 42 formed in the mating surface of the lower force plate 32, and the lower surfaces of the protuberances 44, 45 and 46 press the upper surfaces of the bumper-banging bar 17, bumper 18 and protruded portion 20 that are contained in the holes 40, 41 and 42. In this state, the notches formed at the corners of the lower force cavity recessed portion 33b and opened by the hole 40 are closed by the protuberances 44. Accordingly, the cavity 33 formed by the upper force cavity recessed portion 33a and the lower force cavity recessed portion 33b is sealed substantially completely.

Then, a resin 48 which is to be molded is injected into the cavity 33 from a pot 34 by a plunger 35 via the main runner 37, sub-runner 38 and gate 39. The resin 48 flows through the sub-runner 38 flows along the upper surface of the protruded portion. 20 of the heat sink assembly 12, and is injected into the cavity 33 through a passage surrounded by the protruded portion 20 and the gate 39 formed in the lower force plate 32.

The cavity 33 is filled with the resin 48, which is then thermally set, and the sealing resin member 27 is formed. After the sealing resin member 27 is formed, the upper force plate 31 and the lower force plate 32 are opened. As the mold is opened, the sealing resin member 27 is pushed up by the ejector pins (not shown) and is parted from the upper force plate 31 and the lower force plate 32. During this parting, it is desirable that the ejector pins also push up portions of the heat sink 15 of the assembly 26.

In such a way, the assembly 26 is molded, and parted, completing a molded article 28. The pellet 23, the inner leads 9, the wires 25, part of the heat sink 15, and part of the four bumper-hanging bars 17 of the molded article 28 are sealed inside the sealing resin member 27. That is, the main surface of each of the heat sink 15 and the bumper-hanging bars 17 is exposed from one main surface of the sealing resin member 27, and the other main surface and the side surfaces are buried inside the sealing resin member 27. Furthermore, four bumpers 18 are outwardly and radially protruded from the four corners of the sealing resin member 27.

The flash of the runner and culls appearing during the transfer molding are removed in the removing step. Then, in the step of solder plating, the molded article 28 is plated with solder over all surfaces that are exposed from the sealing resin member 27. Since the series of lead frames 1 and the series of heat sink assemblies 11 in the molded article 28 are all electrically connected, the electroplating with solder is executed at one time.

The molded article 28 is transferred to a step of cutting the leads. In this step, the dam bars 10 are cut off among the neighboring outer leads 8. The outer leads 8 are cut off from the outer frames 3, 4, 5 and 6, and are then bent in the form of a gull wing. The bumpers 18 are cut off from the outer frames 13 and 14. Here, it is desirable that the bumpers 18 and the outer frames 13, 14 are cut at right angles to the diagonal lines of the sealing member 27. By this cutting method, the shape of the bumpers 18 can be easily adjusted, and the edges of the bumpers 18 in parallel with the sides of the sealing resin member 27 can be always positioned on the outer sides of the tips of the outer leads 8, and maintained in the position.

Thus, the QFP 29 that is shown in FIG. 1 is prepared. The QFP 29 is mounted on a printed wiring board as shown in, for example, FIG. 10.

Figure 10A:
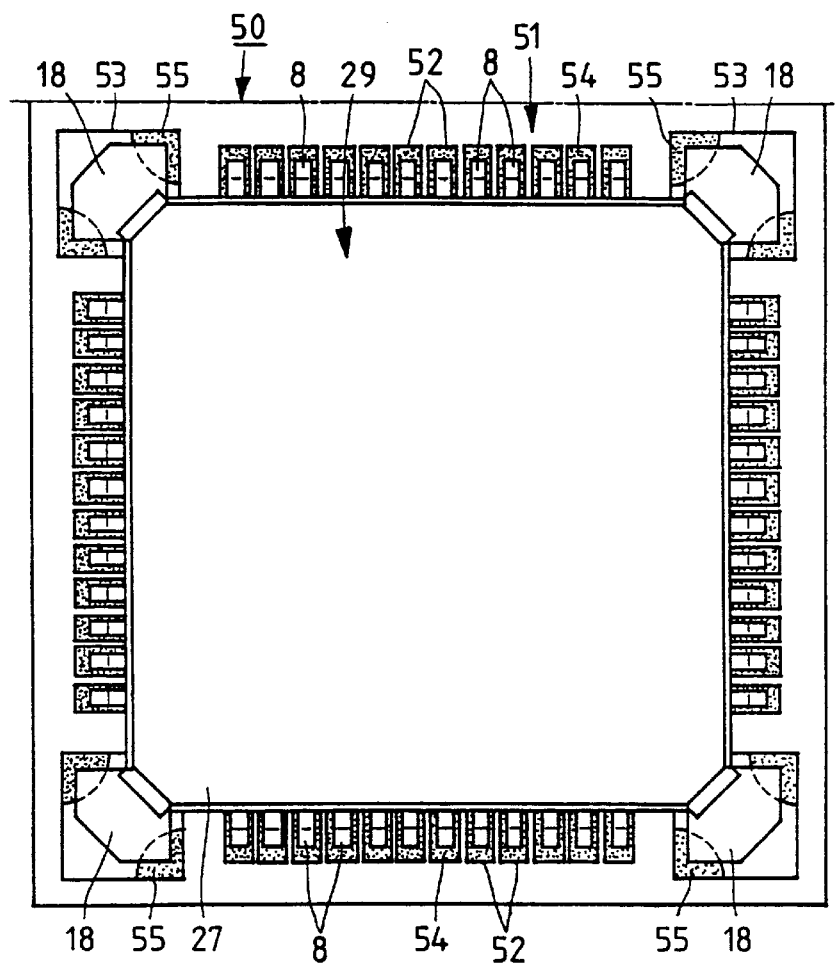
FIG. 10(a) is a plan view.
Figure 10B:
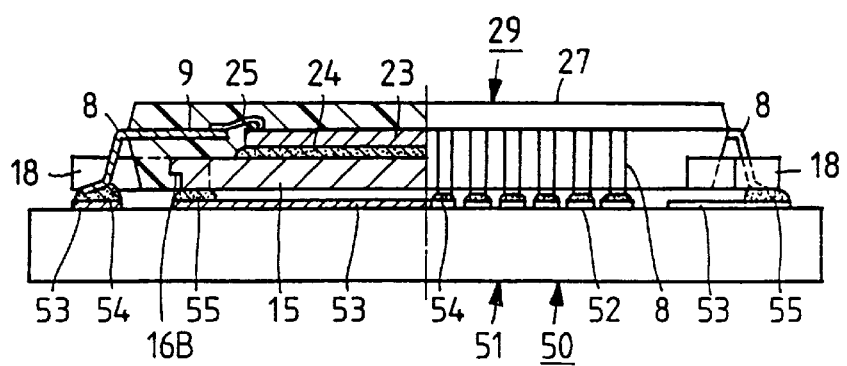
FIG. 10(b) is a sectional view illustrating a portion thereof.

The printed wiring board 50 shown in FIG. 10 has a main body 51 of an insulating plate member made of, for example, glass, epoxy or the like. On one main surface of the main body 51 are formed a plurality of mounting pads 52 of an elongated shape corresponding to flat portions of the outer leads 8, the mounting pads 52 being arranged correspondingly to the rows of the outer leads 8. On the upper surface of the main body 51 are further formed lands 53 for radiating heat at a central portion and at four corners of the square constituted by the rows of mounting pads 52. These lands 53 correspond to the heat sink 15 of the QFP 29 and to the bumpers 18.

To mount the QFP 29 on the surface of the printed wiring board 50, soldering material (not shown) such as cream solder is applied to the mounting pads 52 and to the lands 53 by screen printing, or the like. In this case, the soldering material is applied to the lands 53 partly.

Then, the flat portions of the outer leads 8 of the QFP 29, heat sink 15 and bumpers 18 are adhered to the mounting pads 52 and lands 53 to which the soldering material is applied. In this state, the soldering material is melted by a reflow solder processing, and then solidified. Due to this processing, soldered portions 54 and 55 are formed between the outer leads 8 and the mounting pads 52, between the heat sink 15 and the lands 53, and between the bumpers 18 and the lands 53. Thus, the QFP 29 is mounted on the surface, electrically, and mechanically connected to the printed wiring board 50.

As the pellet 23 becomes hot due to the heat of solder reflow, the heat is conducted to the heat sink 15 since the pellet 23 is directly bonded to the heat sink 15. The heat sink 15 is thicker than the lead frame and has a large area and, hence, has a very low heat resistance. Therefore, the heat of the pellet 23 is conducted to the heat sink 15 highly efficiently, and the heat is dissipated from the heat sink 15 to the mounting board 50 and radiated to the air; i.e., the pellet 23 is efficiently cooled. The heat directly transferred to the heat sink 15 diffuses from the heat sink 15 to the four bumpers 18, and is further radiated into the air. The heat diffused into the heat sink 15 and to the bumpers 18, is then conducted to the lands 53 from the heat sink 15 and the four bumpers 18, and is transferred to the printed wiring board 50. Moreover, the heat of the pellet 23 is directly conducted to the heat sink 15 and is diffused to the whole sealing resin member 27 from the wide surface area of the heat sink 15.

As described above, the QFP 29 of the present invention well radiates the heat and prevents the occurrence of reflow cracks.

The above-mentioned embodiment has the following effects.

(1) Since the pellet 23 is directly bonded to the heat sink 15, the heat of the pellet 23 is conducted to the heat sink 15, making it possible to improve the thermal stability.

(2) Part of the heat sink 15 and the bumpers 18 integrally coupled to the corners of the heat sink 15 are outwardly exposed from the sealing resin member 27. Therefore, the heat absorbed by the heat sink 15 is emitted into the open air, making it possible to further enhance the effect mentioned in item (1).

(3) The tips of the bumpers 18 disposed at four corners of the sealing resin member 27 outwardly protrude beyond the tips of the outer leads 8. Therefore, in case an external force is unexpectedly exerted on the package while the product is being assembled, being shipped to the user, or being mounted by the user, the bumpers 18 absorb the external force to prevent the outer leads 8 from deforming.

(4) In the step of producing the QFP 29, the mechanical coupling portion 21 between the lead frame 2 and the heat sink assembly 12 is not buried inside the sealing resin member 27, and the layout of the inner leads 9 inside the sealing resin member 27 is not limited by the mechanically coupling portion 21.

(5) Owing to the effect mentioned in item (4), the invention can be adapted even to a QFP that has neither heat-radiating fins nor heat-radiating fin leads for coupling the heat-radiating fins to the tabs.

(6) The coupling between the lead frame 2 and the heat sink assembly 12 is accomplished by the mechanical coupling portion 21. Therefore, no gas generates during the coupling, and the pellet is prevented from being contaminated by the gas.

(7) Since the heat sink assembly 12 is coupled to the lead frame 2, the assembling devices that execute the works of the pellet 23 and the inner leads 9 may be those used in the prior art. Moreover, since the lead frames 2 and the heat sink assemblies 12 are formed in series structures the productivity is raised.

(8) Before being coupled, the heat sink assembly 12 is separate from the lead frame 2 and, hence, it is possible to fabricate a heat sink 15 and bumpers 18 having thicknesses larger than that of the lead frame 2. Accordingly, the heat-radiating performance can be further increased with ease. Since the lead frame 2 can be thinly formed, furthermore, the wiring density can be increased.

In the foregoing was concretely described an embodiment of the present invention accomplished by the present inventors. It should, however,;be noted that the invention is in no way limited to the above-mentioned embodiment only but can be modified in a variety of other ways without departing from the gist and scope of the invention.

For instance, the shapes of the sealing resin member and the heat sink are not limited to squares only but may be tetragonal, (for example, rectangular). In particular, the heat sink needs not be limited to a regular tetragon but may be circular or polygonal.

The heat sink assemblies are not limited to the series structures but may be constituted in a single unit which may then be assembled on a series of lead frames.

The mechanical coupling between the heat sink and the lead frame is not limited to caulking, but may be a weld using the soldering material. In this case, the coupling holes can be omitted.

The heat sink is not limited to the structure in which it is partly buried in the sealing resin member but may have a structure that the heat sink is entirely buried in it. When the heat sink is partly exposed through the main surface of the sealing resin member, the external heat-radiating fins may be attached thereto. In such a case, the outer leads may be bent in the direction of the main surface on the side opposite to the heat sink.

In the bumpers may be formed bolt-insertion holes and internal threads.

The material for forming the heat sink assembly is not limited to the copper-type material but may be any other metal material having a good heat conductivity, such as an aluminum-type material (aluminum or alloy thereof) or the like. In particular, it is desirable to use a material having an excellent heat conductivity, such as silicon carbide (SiC), and having a coefficient of thermal expansion which is nearly equal to that of silicon which is a material of the pellet.

In the foregoing embodiment, the heat sink and the bumpers are soldered to the lands of the printed wiring board. However, a sufficiently high heat-radiating performance is exhibited even when the heat sink and the bumpers are not soldered.

Moreover, the heat sink may be used to serve as an electrically conducting member for the ground terminal and the feeder terminal.

The foregoing description was made about the case where the invention accomplished by the present inventors was adapted to the QFP IC in the field of art which is the background of the invention. The invention, however, is in no way limited thereto only but can be adapted to surface-mount resin-sealed packages such as QFJ, QFI, etc., as well as to packages for power transistors and other electronic devices in general. In particular, the invention produces excellent effects when it is utilized for semiconductor devices which are required to be small in size, have many pins, be inexpensive, and have a high heat-radiating performance.

What is claimed is:

1. A semiconductor device comprising:

a semiconductor chip, a resin body of a tetragonal shape sealing the semiconductor chip, a plurality of outer leads electrically connected with the semiconductor chip and protruding from four sides of the resin body, and four bumper portions protruding respectively from four corners of the resin body, wherein the plurality of outer leads are positioned entirely within a polygon consisting in plan view of extreme tips of the four bumper portions and lines connecting the extreme tips of the four bumper portions.

2. A semiconductor device comprising:

a heat sink having a chip mounting portion and four bumper portions which are integral with the heat sink, a semiconductor chip mounted on the chip mounting portion, a resin body of a tetragonal shape sealing the semiconductor chip, and a plurality of outer leads electrically connected with the semiconductor chip and protruding from four sides of the resin body, wherein the four bumper portions protrude respectively from four corners of the resin body, the plurality of outer leads are positioned entirely within a polygon consisting in plan view of extreme tips of the four bumper portions and lines connecting the extreme tips of the four bumper portions, the four bumper portions are each thicker and wider than each one of the plurality of outer leads, and the heat sink and four bumper portions have an integral flat rear surface protruding from the resin body.

3. A semiconductor device comprising:

a heat sink having a chip mounting portion and four bumper portions, a semiconductor chip mounted on the chip mounting portion, a resin body of a tetragonal shape sealing the semiconductor chip, and a plurality of outer leads electrically connected with the semiconductor chip and protruding from four sides of the resin body, wherein the four bumper portions protrude respectively from four corners of the resin body, the plurality of outer leads are positioned entirely within a polygon consisting in plan view of extreme tips of the four bumper portions and lines connecting the extreme tips of the four bumper portions, the four bumper portions each are thicker and wider than each one of the plurality of outer leads, and the heat sink and four bumper portions have a monolithic flat rear surface protruding from the resin body.

4. A semiconductor device according to claim 3, wherein:

a rear surface of each of the plurality of outer leads is positioned lower than the rear surface of each of the four bumper portions when the semiconductor device is in an unmounted state.

* * * * *